(12) United States Patent
Doi et al.

(10) Patent No.: US 10,483,738 B2
(45) Date of Patent: Nov. 19, 2019

(54) ELECTRICAL CONNECTION BOX AND WIRE HARNESS

(71) Applicants: Yazaki Corporation, Tokyo (JP); TOYOTA JIDOSHA KABUSHIKI KAISHA, Toyota-shi, Aichi-ken (JP)

(72) Inventors: Teppei Doi, Shizuoka (JP); Kimihiro Ishii, Shizuoka (JP); Tomohiko Saito, Shizuoka (JP); Takayoshi Furukawa, Shizuoka (JP); Tadashi Fujita, Aichi (JP); Yasuhiro Yamazaki, Aichi (JP); Takashi Maruyama, Aichi (JP); Atsushi Kawamura, Shizuoka (JP); Akihito Tsukamoto, Aichi (JP); Takumi Matsumoto, Aichi (JP)

(73) Assignees: YAZAKI CORPORATION, Minato-ku, Tokyo (JP); TOYOTA JIDOSHA KABUSHIKI KAISHA, Toyota-shi, Aichi-ken (JP)

( * ) Notice: Subject to any disclaimer, the term of this patent is extended or adjusted under 35 U.S.C. 154(b) by 0 days.

(21) Appl. No.: 16/011,828

(22) Filed: Jun. 19, 2018

(65) Prior Publication Data
US 2019/0013657 A1 Jan. 10, 2019

(30) Foreign Application Priority Data
Jul. 4, 2017 (JP) .................. 2017-130832

(51) Int. Cl.
*H05K 5/00* (2006.01)
*H02G 3/08* (2006.01)
(Continued)

(52) U.S. Cl.
CPC ........... *H02G 3/083* (2013.01); *H01B 7/0045* (2013.01); *H02G 3/14* (2013.01); *H02G 5/08* (2013.01);
(Continued)

(58) Field of Classification Search
None
See application file for complete search history.

(56) References Cited

U.S. PATENT DOCUMENTS

2004/0109296 A1* 6/2004 Nakayama ............. H01R 9/223
361/752
2008/0247133 A1* 10/2008 Ito ........................ H01H 50/021
361/730

(Continued)

FOREIGN PATENT DOCUMENTS

JP 2002-299859 A 10/2002
JP 2006-40805 A 2/2006

*Primary Examiner* — Courtney L Smith
(74) *Attorney, Agent, or Firm* — Sughrue Mion, PLLC

(57) ABSTRACT

An electrical connection box applied to a wire harness includes a substrate assembly and a housing the substrate assembly. The housing includes a first flexible rib that is extended along an extending direction Z, elastically deformable along a first support direction X, and supports the substrate assembly with respect to one side in the first support direction X, second flexible ribs that are extended along the extending direction Z, elastically deformable along the first support direction X, and supports the substrate assembly with respect to the other side in the first support direction X, and boss portions that are extended along the extending direction Z and position the substrate assembly with respect to the both sides in the first support direction X.

18 Claims, 8 Drawing Sheets

(51) Int. Cl.
  *H01B 7/00*    (2006.01)
  *H02G 5/08*    (2006.01)
  *H02G 3/14*    (2006.01)
  *B60R 16/023*  (2006.01)
  *B60R 16/02*   (2006.01)

(52) U.S. Cl.
  CPC ......... *H05K 5/0017* (2013.01); *H05K 5/0047* (2013.01); *B60R 16/0207* (2013.01); *B60R 16/0238* (2013.01)

(56) References Cited

U.S. PATENT DOCUMENTS

| | | | | |
|---|---|---|---|---|
| 2010/0202120 | A1* | 8/2010 | Kita | B60R 16/0238 |
| | | | | 361/752 |
| 2010/0328908 | A1* | 12/2010 | Nakashima | H01R 9/2466 |
| | | | | 361/752 |
| 2013/0044447 | A1* | 2/2013 | Shiozaki | H05K 1/0203 |
| | | | | 361/752 |
| 2016/0156162 | A1* | 6/2016 | Yamaguchi | H05K 7/02 |
| | | | | 361/624 |

* cited by examiner

ELECTRICAL CONNECTION BOX AND WIRE HARNESS

CROSS-REFERENCE TO RELATED APPLICATION(S)

The present application claims priority to and incorporates by reference the entire contents of Japanese Patent Application No. 2017-130832 filed in Japan on Jul. 4, 2017.

BACKGROUND OF THE INVENTION

1. Field of the Invention

The present invention relates to an electrical connection box and a wire harness.

2. Description of the Related Art

As a technique relating to a conventional electrical connection box applied to a wire harness in a vehicle or the like, Japanese Patent Application Laid-open No. 2002-299859 discloses a printed board mounting structure, for example. The printed board mounting structure is configured such that an elastic support member is provided in contact with the inner peripheral surface of a mounting hole in the printed board. When external force is applied to the printed board, the support member bends to move the printed board.

The printed board mounting structure described in Japanese Patent Application Laid-open No. 2002-299859 has room for further improvement in holding the board in a more proper manner, for example.

SUMMARY OF THE INVENTION

The present invention is devised in light of the foregoing circumstances. An object of the present invention is to provide an electrical connection box that can hold properly internal components in a housing, and a wire harness.

In order to achieve the above mentioned object, an electrical connection box according to one aspect of the present invention includes a substrate assembly that has a substrate on which an electronic component is provided and a conductive member extended from the substrate, the substrate and the conductive member being assembled to each other; and a housing including a housing space portion that is internally formed to house the substrate assembly, an insertion hole that communicates internally and externally with the housing space portion to insert the conductive member along an insertion direction, a first flexible rib that is extended along an extending direction, elastically deformable along a first support direction crossing the extending direction and the insertion direction, and supports the substrate assembly with respect to one side in the first support direction, a second flexible rib that is extended along the extending direction, elastically deformable along the first support direction, and supports the substrate assembly with respect to the other side in the first support direction, and a boss portion that is extended along the extending direction and positions the substrate assembly with respect to the both sides in the first support direction.

According to another aspect of the present invention, in the electrical connection box, it is possible to configure that the substrate assembly has a block that is assembled to the substrate at a position opposed to the insertion hole along the insertion direction to hold the conductive member in the housing space portion, and the block has a first abutment surface to abut with the first flexible rib, a second abutment surface to abut with the second flexible rib, and a positioning concave portion into which the boss portion is inserted, having a third abutment surface to abut with the boss portion on the both sides in the first support direction.

According to still another aspect of the present invention, in the electrical connection box, it is possible to configure that a heavy article holding a plurality of electronic components is assembled to the block.

According to still another aspect of the present invention, in the electrical connection box, it is possible to configure that the first flexible rib, the second flexible rib, and the boss portion protrude and extend to the same side along the extending direction from an inner wall surface forming the housing space portion and have leading end positions different from one another with respect to the extending direction.

According to still another aspect of the present invention, in the electrical connection box, it is possible to configure that the one first flexible rib is provided, the pair of second flexible ribs is provided with the first flexible rib interposed therebetween, the pair of boss portions is provided with the first flexible ribs and the pair of second flexible ribs interposed therebetween, and the first flexible rib, the pair of second flexible ribs, and the pair of boss portions protrude and extend to the same direction along the extending direction from an inner wall surface forming the housing space portion, have base end positions aligned with one another with respect to the extending direction, and have lengths along the extending direction that are larger in the order of the pair of second flexible ribs, the pair of boss portions, and the first flexible rib.

According to still another aspect of the present invention, in the electrical connection box, it is possible to configure that the housing includes a third flexible rib that is extended along the extending direction, elastically deformable along a second support direction crossing the insertion direction and the first support direction, and supports the substrate assembly with respect to one side in the second support direction, and a fourth flexible rib that is extended along the extending direction, elastically deformable along the second support direction, and supports the substrate assembly with respect to the other side in the second support direction.

In order to achieve the above mentioned object, a wire harness according to still another aspect of the present invention includes a conductive wiring material; and an electrical connection box electrically connected to the wiring material, wherein the electrical connection box includes: a substrate assembly that has a substrate on which an electronic component electrically connected to the wiring material is provided and a conductive member extended from the substrate, the substrate and the conductive member being assembled to each other; and a housing including a housing space portion that is internally formed to house the substrate assembly, an insertion hole that communicates internally and externally with the housing space portion to insert the conductive member along an insertion direction, a first flexible rib that is extended along an extending direction, elastically deformable along a first support direction crossing the extending direction and the insertion direction, and supports the substrate assembly with respect to one side in the first support direction, a second flexible rib that is extended along the extending direction, elastically deformable along the first support direction, and supports the substrate assembly with respect to the other side in the first support direction, and a boss portion that is extended along the extending direction and positions the substrate assembly with respect to the both sides in the first support direction.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

An embodiment of the present invention will be described below in detail with reference to the drawings. The present invention is not limited to the embodiment. The components of the embodiment below include ones replaceable and easily conceivable for a person skilled in the art or substantially equal ones.

Figure 1:
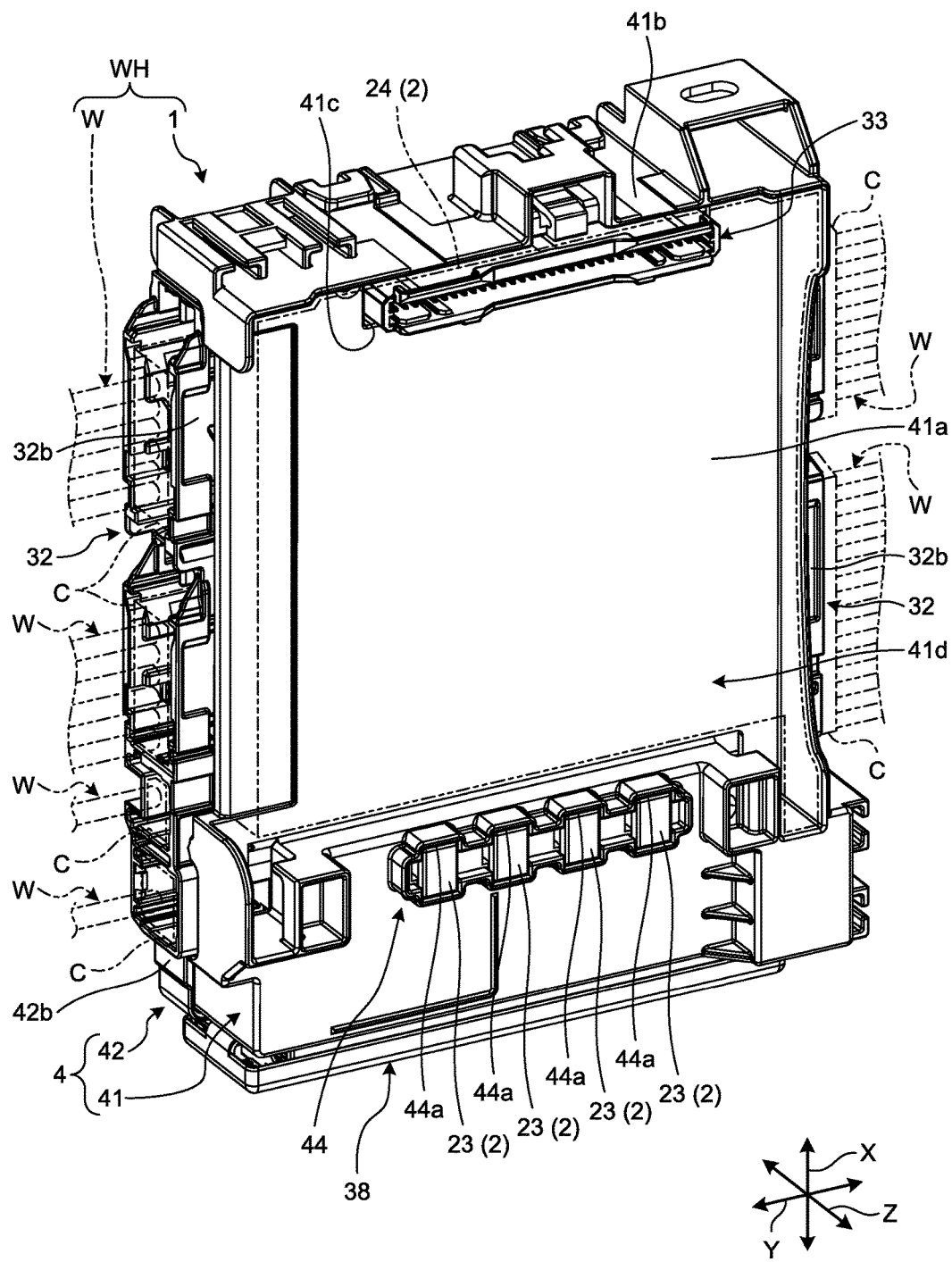
FIG. 1 is a perspective view of a schematic configuration of an electrical connection box according to an embodiment.
Figure 2:
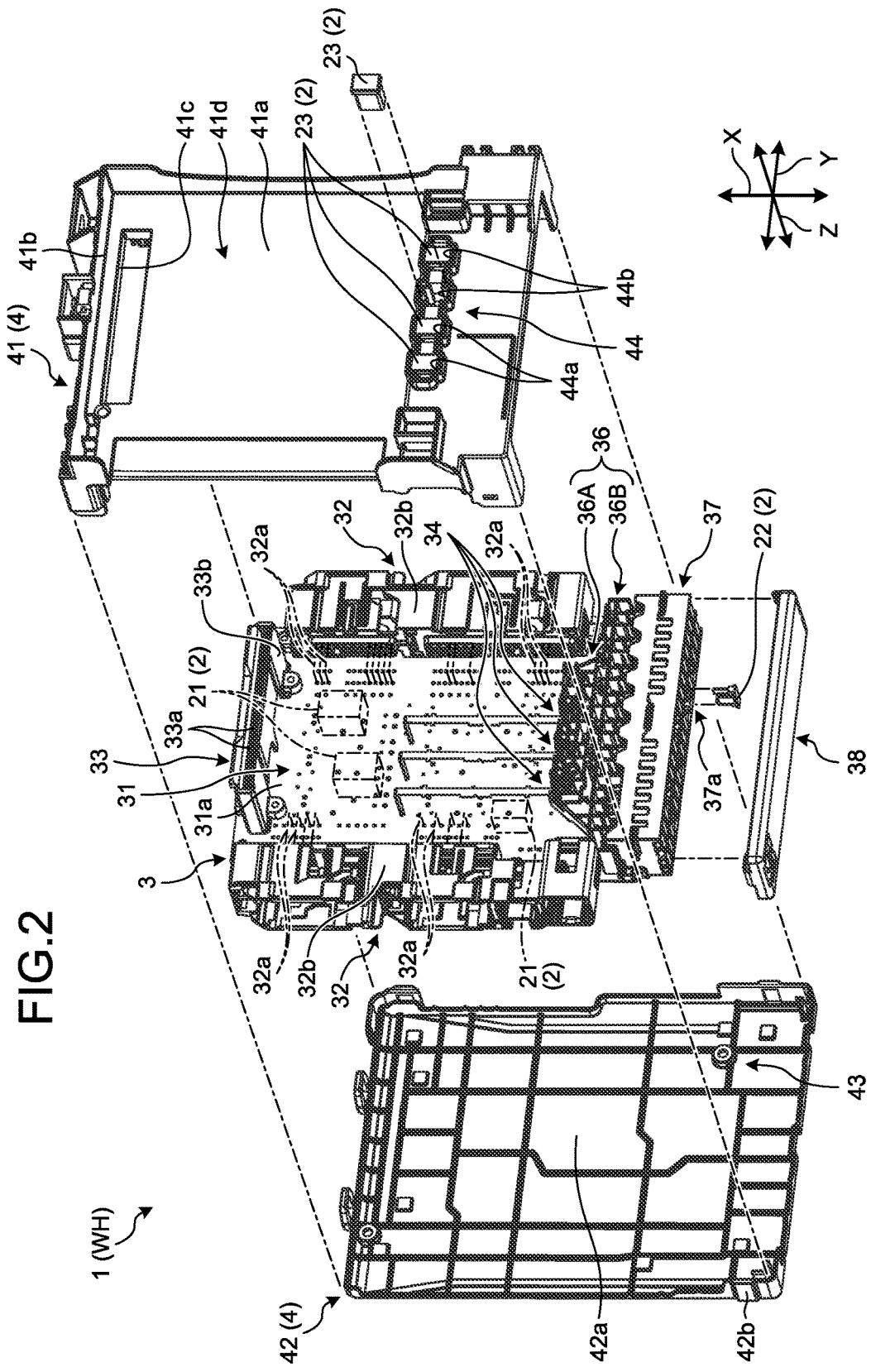
FIG. 2 is an exploded perspective view of the schematic configuration of the electrical connection box according to the embodiment.
Figure 3:
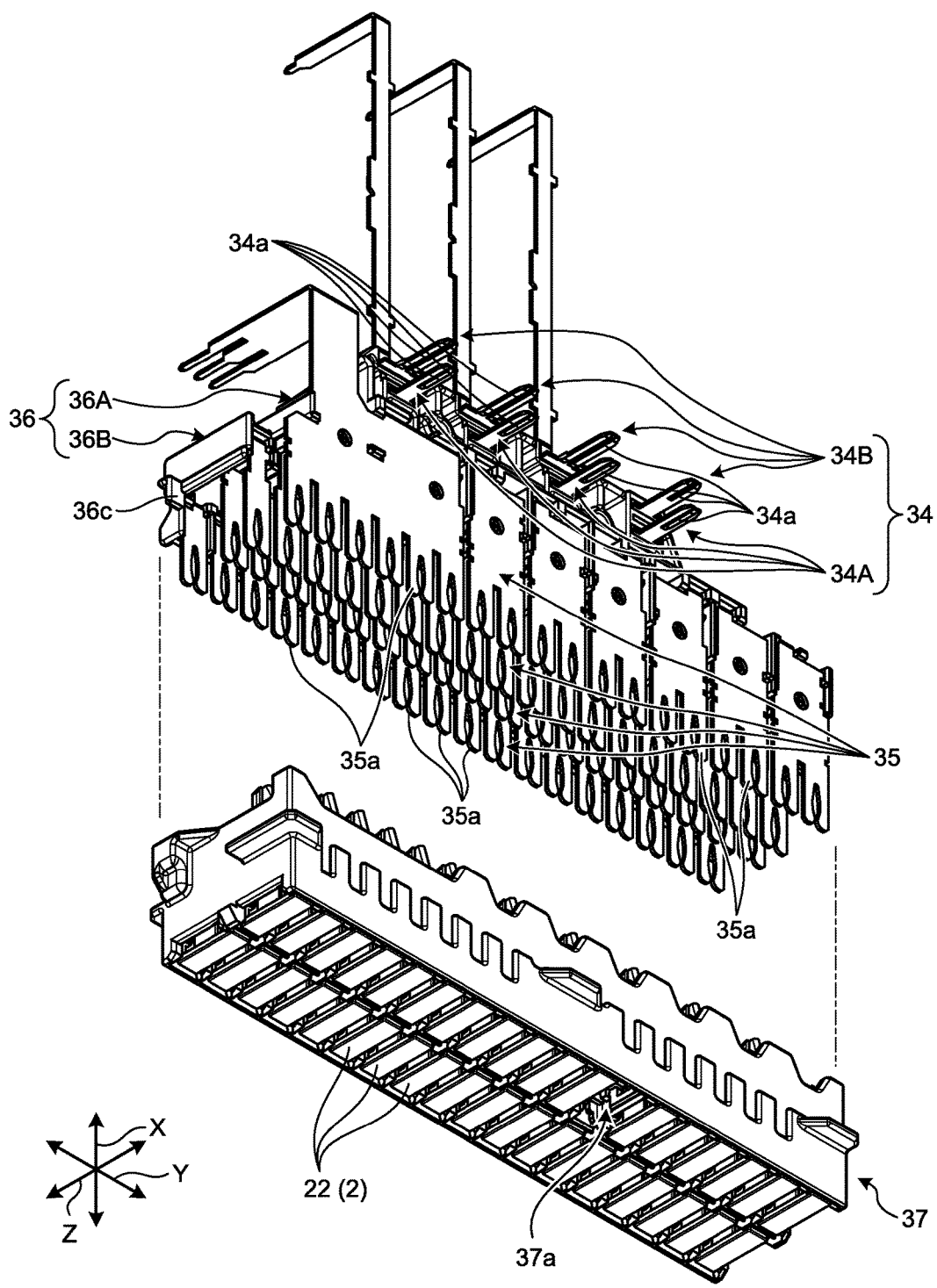
FIG. 3 is a partial exploded perspective view of the electrical connection box including a bus bar block and a fuse holder according to the embodiment.

FIG. 1 illustrates partially wiring materials and other-end connectors by two-dot chain lines but the other drawings do not illustrate the wiring materials and the other-end connectors. FIG. 2 illustrates some of electronic components and bent terminals provided on the substrate by two-dot chain lines but does not illustrate the remaining components. The other drawings do not illustrate the electronic components and the bent terminals at all. FIG. 3 illustrates fuse bus bars provided in a bus bar block by solid lines but the other drawings do not illustrate the fuse bus bars. There will appear a first direction, a second direction, and a third direction crossing one another in the following description. The first direction will be called "long-side direction X", the second direction "short-side direction Y", and the third direction "thickness direction Z". In this case, the long-side direction X, the short-side direction Y, and the thickness direction Z are orthogonal to (cross) one another. Typically, while the electrical connection box is installed in a vehicle and the vehicle is positioned on a horizontal plane, the long-side direction X aligns with the perpendicular direction, the short-side direction Y and the thickness direction Z align with the horizontal direction. In this case, the long-side direction X is equivalent to a first support direction in the housing. The short-side direction Y is equivalent to a second support direction in the housing. The thickness direction Z is equivalent to the insertion direction of the conductive member into the insertion hole in the housing and the extending direction of the first flexible rib, the second flexible ribs, the third flexible rib, the fourth flexible rib, and the boss portions. In the following description, unless otherwise specified, the individual directions are defined in the state where the individual components are assembled into one another and the electrical connection box is mounted on a vehicle.

Embodiment

An electrical connection box 1 according to an embodiment illustrated in FIGS. 1 and 2 is mounted on a vehicle such as an automobile and incorporated into a wire harness WH. The wire harness WH is structured to connect individual devices mounted on the vehicle, for example, such that a plurality of wiring materials W used for power supply and signal communication is bundled into a collective component and connected to the individual devices by connectors or the like. The wire harness WH includes the conductive wiring materials W and the electrical connection box 1 electrically connected to the wiring materials W. The wiring material W is made from a metallic bar, electrical wire, electrical wire bundle, or the like, for example. The metallic bar is formed by covering a conductive bar-like member with an insulating coating. The electric wire is formed by covering a conductor (core line) made from a plurality of conductive metallic wires with an insulating coating. The electric wire bundle is formed by binding the foregoing electric wires. The wire harness WH bundles and converges the plurality of wiring materials W. The electrical connection box 1 is electrically connected to the wire harness WH via counterpart connectors C provided in the terminals of the bundled wiring materials W. The wire harness WH may further include a grommet, a protector, a fixing tool, and others.

The electrical connection box 1 houses electrical components such as connectors, fuses, relays, capacitors, bifurcation portions, and electronic control units in a collective manner. The electrical connection box 1 is installed in the engine room or the interior of the vehicle, for example. The electrical connection box 1 is connected between a power source such as a battery and various electronic devices mounted on the vehicle via the wiring materials W and the like. The electrical connection box 1 distributes electric power from the power source to the various electronic devices in the vehicle. The electrical connection box 1 may also be called junction box, fuse box, relay box, or the like. In the embodiment, they are collectively called electrical connection box. The electrical connection box 1 in the embodiment is configured such that a housing 4 is formed in various shapes to hold properly a substrate assembly 3 as an internal component housed in the housing 4. The configuration of the electrical connection box 1 will be described below in detail with reference to the drawings.

The electrical connection box 1 in the embodiment includes an electronic component 2, the substrate assembly 3, and the housing 4 as illustrated in FIGS. 1 and 2.

The electronic component 2 is an element or unit performing various functions. The electronic component 2 is electrically connected to the wiring materials W. A plurality of the electronic components 2 is provided. The electronic components 2 include, for example, a capacitor, relay, resistor, transistor, fuse, intelligent power switch (IPS), an electronic control unit including microcomputer, or the like. Some of the electronic components 2 are housed in the housing 4 and the other are exposed to the outside of the housing 4. In the drawing, the electronic components 2 include a relay 21 housed in the housing 4, a fuse 22, a fusible link 23, an electronic control unit (ECU) 24, and others exposed to the outside of the housing 4.

The substrate assembly 3 is housed in the housing 4. The substrate assembly 3 is housed in the housing 4 while being partly exposed to the outside of the housing 4. The substrate assembly 3 has a substrate 31, a printed circuit board (PCB) connector 32, an ECU connector 33, a fusible link bus bar (hereinafter, also called fusible link (FL) bus bar) 34, a fuse bus bar 35 (see FIG. 3), a bus bar block 36, a fuse holder 37, a fuse cover 38, and others. The substrate assembly 3 is formed by assembling the substrate 31, the PCB connector 32, the ECU connector 33, the FL bus bar 34, the fuse bus bar 35, the bus bar block 36, the fuse holder 37, and the fuse cover 38 to each other.

The substrate 31 is provided with the electronic components 2, housed in the housing 4 together with the electronic components 2, and electrically connected to the wiring materials W. The substrate 31 constitutes an electronic circuit in which the electronic components 2 are implemented on an implementation plane 31a and are electrically connected together. As the electronic components 2, for example, the relay 21 and others are implemented on the substrate 31. In this case, the substrate 31 is a printed-circuit board (PCB), for example. The substrate 31 has a circuit body formed by printing a wiring pattern (print pattern) of a conductive material such as copper on an insulation layer of an insulating material such as an epoxy resin, glass epoxy resin, paper epoxy resin, or ceramic. The substrate 31 is formed in the shape of an almost rectangular plate in which the thickness direction Z aligns with a plate thick direction, the long-side direction X aligns with the long side, and the short-side direction Y aligns with the short side. The electronic components 2 are implemented on the implementation plane 31a of the substrate 31 by electrically connecting the lead wires and terminals of the electronic components 2 to the circuit body by means of soldering or the like. The circuit body of the substrate 31 electrically connects the plurality of electronic components 2, the PCB connector 32, the ECU connector 33, the FL bus bar 34, the fuse bus bar 35, and others described later to constitute a circuit system in accordance with the required functions. The substrate 31 is not limited to a printed-circuit board but may be an insert bus bar board in which a conductive metallic bus bar is built in an insulating resin material. In this case, the substrate 31 is formed by covering the bus bar as a circuit body made of a conductive metallic material with an insulating resin material, for example.

The PCB connector 32 is a substrate-implemented connector that is implemented on the implementation plane 31a of the substrate 31. The PCB connector 32 constitutes an electric wire-substrate connection mechanism or the like that connects electrically the counterpart connectors C provided at the terminals of the wiring materials W to the substrate 31. The PCB connector 32 includes pluralities of bent terminals 32a and connector blocks 32b. The plurality of bent terminals 32a is intended to connect electrically the substrate 31 and the counterpart connectors C. Each of the bent terminals 32a is entirely formed from a conductive metallic material or the like and is coated with a conductive plating or the like. Each of the bent terminals 32a is formed by bending a bar-like square wire material in an almost L shape. The connector blocks 32b constitute connector housings that house and hold the bent terminals 32a and are capable of fitting to the counterpart connectors C. The connector blocks 32b are formed from an insulating resin material. In this case, one each connector block 32b is provided at each end of the substrate 31 in the short-side direction Y, which means that the total two connector blocks 32b are provided. The connector blocks 32b are extended along the long-side direction X. The connector blocks 32b are fixed to the implementation plane 31a of the substrate 31 via a fixing tool such as a screw, for example. Each of the bent terminals 32a has one end held in a cavity of the connector block 32b and the other end electrically connected to the circuit body of the substrate 31. In the PCB connector 32, the counterpart connectors C are fitted to the connector blocks 32b to connect electrically the bent terminals 32a and the counterpart connectors C. According to this configuration, the substrate 31 is electrically connected to the wiring materials W via the PCB connectors 32 and the counterpart connectors C, and the electronic components 2 and the wiring materials W are electrically connected via the circuit body.

The ECU connector 33 is a substrate-implemented connector that is implemented on the implementation plane 31a of the substrate 31. The ECU connector 33 constitutes an electronic component-substrate connection mechanism or the like that connects electrically the ECU 24 and the substrate 31. The ECU connector 33 includes a plurality of straight terminals 33a and a pin header 33b. The plurality of straight terminals 33a is intended to connect electrically the substrate 31 and the ECU 24. Each of the straight terminals 33a is entirely formed from a conductive metallic material or the like and is coated with a conductive plating or the like. Each of the straight terminals 33a is formed in a linear bar shape from a bar-like square wire material. The pin header 33b constitutes a connector housing that houses and holds the straight terminals 33a and is capable of fitting to the ECU 24. The pin header 33b is formed from an insulating resin material. In this case, the one pin header 33b is provided at an end of the substrate 31 on the one side in the long-side direction X. The pin header 33b is extended along the short-side direction Y. The pin header 33b is fixed to the implementation plane 31a of the substrate 31 via a fixing tool such as a screw, for example. Each of the straight terminals 33a has one end held in a cavity of the pin header 33b and the other end electrically connected to the circuit body of the substrate 31. In the ECU connector 33, the ECU 24 is fitted to the pin header 33b to connect electrically the straight terminals 33a and the ECU 24. According to this configuration, the substrate 31 is electrically connected to the ECU 24 via the ECU connector 33, and the electronic components 2 and the ECU 24 are electrically connected via the circuit body.

Figure 4:
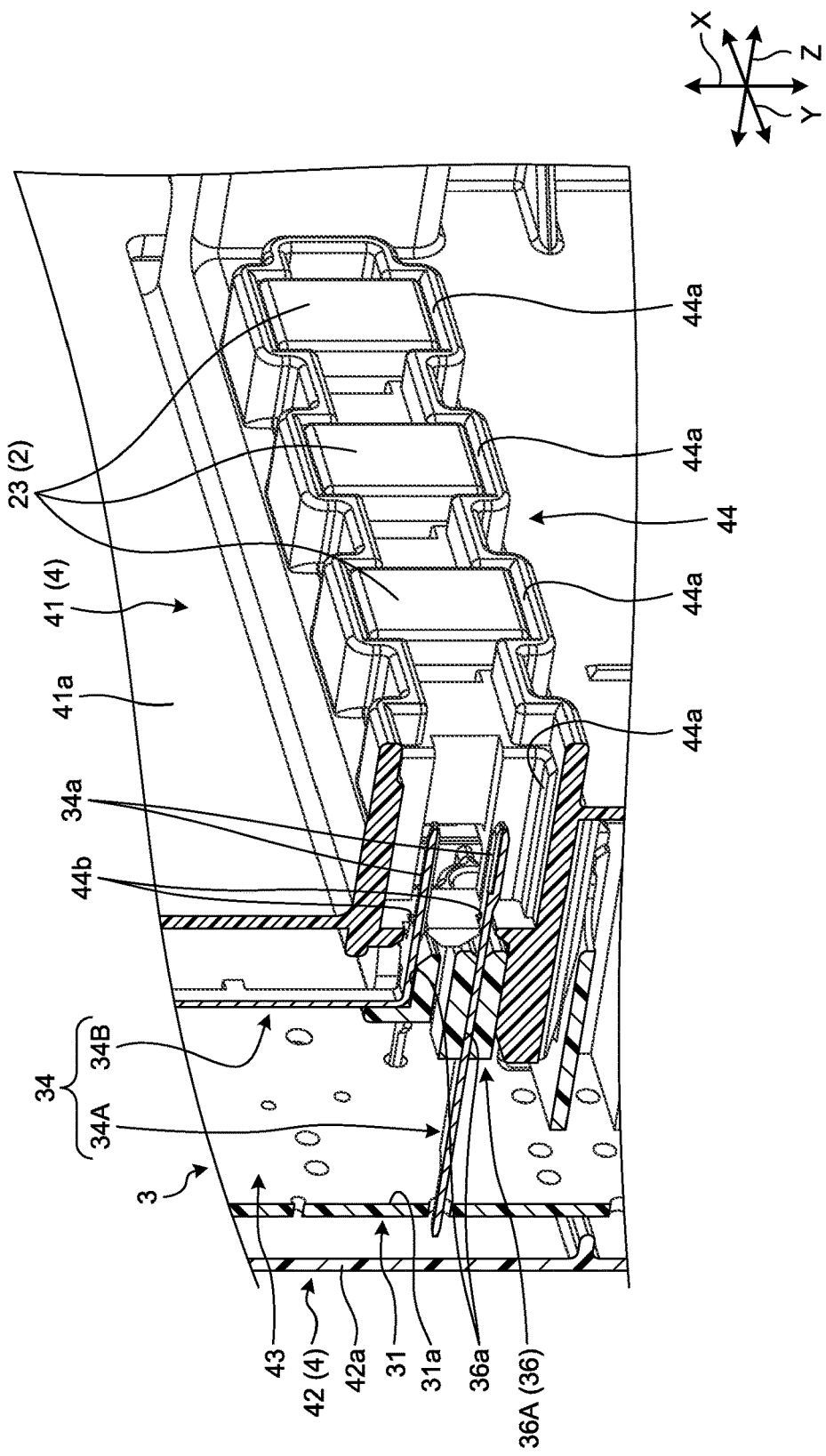
FIG. 4 is a partial perspective cross-section view of the electrical connection box including the bus bar block according to the embodiment.
Figure 5:
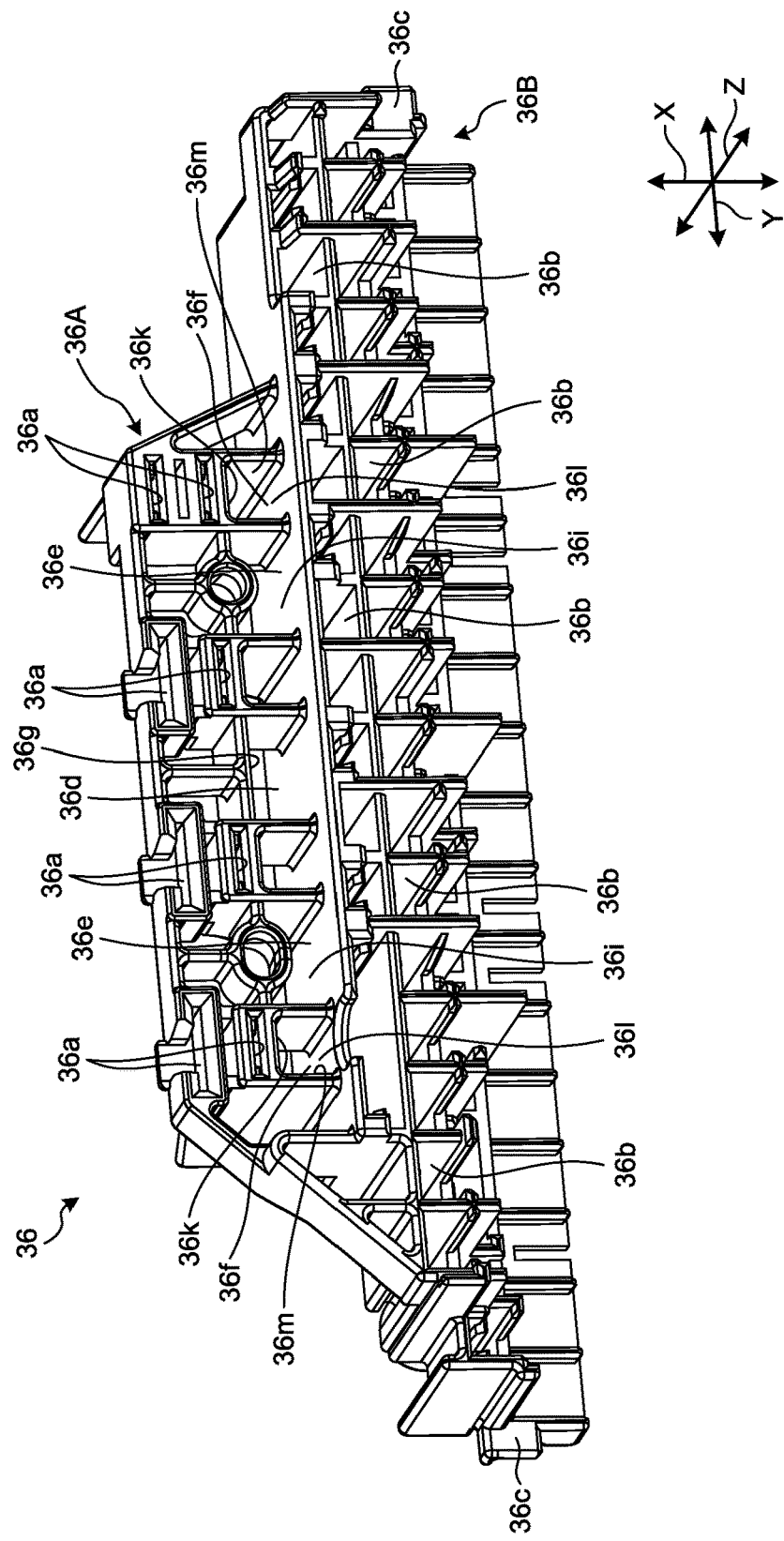
FIG. 5 is a perspective view of a schematic configuration of the bus bar block in the electrical connection box according to the embodiment.

The FL bus bar 34 extends from the substrate 31 and constitutes a conductive member that is partly inserted into the housing 4 along the thickness direction Z and exposed to the outside of the housing 4 as illustrated in FIGS. 2 to 4. The FL bus bar 34 is intended to connect electrically the substrate 31 and the fusible link 23. The FL bus bar 34 is entirely formed from a conductive metallic material or the like and is coated with a conductive plating or the like. A plurality of the FL bus bars 34 is provided. Each of the FL bus bars 34 is electrically connected to the input terminal or the output terminal of the fusible link 23. In this case, the FL bus bars 34 include a plurality of first bus bars 34A and a plurality of second bus bars 34B. One each of the first bus bars 34A and the second bus bars 34B is provided to one fusible link 23. In this case, one each of the first bus bars 34A and the second bus bars 34B is provided to four fusible links 23, which means that the total four each first bus bars 34A and second bus bars 34B are provided. Each of the first bus bars 34A is linearly extended in the thickness direction Z. Each of the first bus bars 34A is erected vertically from the implementation plane 31a of the substrate 31 and held by the bus bar block 36. One of the second bus bars 34B is linearly extended in the thickness direction Z as with the first bus bars 34A, and the remaining three are formed in a crank shape with a plurality of bent portions. The linear one of the second bus bars 34B is erected vertically from the implementation plane 31a of the substrate 31 and held by the bus bar block 36. Each of the crank-shaped second bus bars 34B has an end on the substrate 31 side erected vertically from the implementation plane 31a of the substrate 31 and held at the bent portion by the bus bar block 36. Each of the FL bus bars 34 has one end electrically connected to the circuit body of the substrate 31 and the other end constituting an exposed end 34a. The exposed end 34a is inserted into the housing 4 along the thickness direction Z and exposed to the outside of the housing 4.

The fuse bus bar 35 constitutes a conductive member that extends from the substrate 31 and is partly exposed to the outside of the housing 4 along the long-side direction X as illustrated in FIG. 3. The fuse bus bar 35 is intended to connect electrically the substrate 31 and the fuse 22. The fuse bus bar 35 is entirely formed from a conductive metallic material or the like and is coated with a conductive plating or the like. A plurality of the fuse bus bars 35 is provided. Each of the fuse bus bars 35 is electrically connected to the input terminal or the output terminal of the fuse 22. Each of the fuse bus bars 35 is formed in an almost L shape. In this case, there are a plurality of kinds of the fuse bus bars 35 different in bending position and shape. Each of the fuse bus bars 35 has an end on the substrate 31 side erected vertically from the implementation plane 31a of the substrate 31 and the other end held by the bus bar block 36. Each of the fuse bus bars 35 has one end electrically connected to the circuit body of the substrate 31 and the other end constituting an exposed end 35a. The exposed ends 35a are exposed to the outside of the housing 4 along the long-side direction X. In this case, the exposed ends 35a are formed in a fork shape (bifurcated shape).

The bus bar block 36 is intended to hold the FL bus bars 34 in the housing 4 (a housing space portion 43 described later) as illustrated in FIGS. 2, 3, 4, and 5. In this case, the bus bar block 36 is also used as a portion for holding the fuse bus bars 35 in the housing 4. The bus bar block 36 is formed from an insulating resin material. The one bus bar block 36 is provided at the end of the substrate 31 on the other side in the long-side direction X, that is, at the end of the substrate 31 opposed to the pin header 33b. The bus bar block 36 is extended along the short-side direction Y. The bus bar block 36 has an FL bus bar holding portion 36A that holds the FL bus bars 34 and a fuse bus bar holding portion 36B that holds the fuse bus bars 35, two of which are integrally formed. The bus bar block 36 is fixed to the implementation plane 31a of the substrate 31 by a fixing tool such as a screw, for example. The bus bar block 36 is assembled into the substrate 31 such that the FL bus bar holding portion 36A is positioned inside the substrate 31 in the long-side direction X (in other words, the one side in the long-side direction X) and the fuse bus bar holding portion 36B is positioned outside the substrate 31 in the long-side direction X (in other words, the other side in the long-side direction X). The bus bar block 36 in the embodiment is assembled on the implementation plane 31a of the substrate 31 at a position where the FL bus bar holding portion 36A is opposed to insertion holes 44b of the housing 4 along the thickness direction Z. The insertion holes 44b will be described later.

The FL bus bar holding portion 36A is extended along the short-side direction Y. The FL bus bar holding portion 36A has a plurality of cavities 36a along the thickness direction Z to hold partially the FL bus bars 34 in the cavities 36a. The cavities 36a penetrate through the bus bar block 36 along the thickness direction Z. While being held by the FL bus bar holding portion 36A, each of the FL bus bars 34 has one end electrically connected to the circuit body of the substrate 31 and the other end constituting the exposed end 34a as described above. The FL bus bar holding portion 36A holds the first bus bars 34A and the second bus bars 34B such that the exposed ends 34a of the first bus bars 34A are spaced along the short-side direction Y and the exposed ends 34a of the second bus bars 34B are spaced along the short-side direction Y. While being held by the FL bus bar holding portion 36A, one each of the exposed ends 34a of the first bus bars 34A and one each of the exposed ends 34a of the second bus bars 34B are opposed to each other in a pair along the long-side direction X. In this case, the exposed ends 34a of the second bus bars 34B are positioned on one side in the long-side direction X, and the exposed ends 34a of the first bus bars 34A are positioned on one side in the long-side direction X.

The fuse bus bar holding portion 36B is extended along the short-side direction Y as with the FL bus bar holding portion 36A. The fuse bus bar holding portion 36B has a plurality of cavities 36b along the thickness direction Z to hold partially the fuse bus bars 35 in the cavities 36b. The cavities 36b penetrate through the bus bar block 36 along the thickness direction Z. While being held by the fuse bus bar holding portion 36B, each of the fuse bus bars 35 has one end electrically connected to the circuit body of the substrate 31 and the other end constituting the exposed end 35a as described above. The fuse bus bar holding portion 36B has a holder attachment portion 36c to which the fuse holder 37 described later is attached and assembled.

The bus bar block 36 in the embodiment has a plurality of cavities 36d, 36e, and 36f along the thickness direction Z, separately from the cavities 36a and 36b, between the FL bus bar holding portion 36A and the fuse bus bar holding portion 36B. The cavities 36d, 36e, and 36f penetrate through the bus bar block 36 along the thickness direction Z. The cavity 36d constitutes a positioning concave portion into which a first flexible rib 45 described later is inserted. The cavities 36e constitute positioning concave portions into which second flexible ribs 46 described later are inserted. The cavities 36f constitute positioning concave portions into which boss portions 47 described later are inserted. The cavities 36d, 36e, and 36f are spaced along the short-side direction Y. The one cavity 36d is provided in almost the middle in the short-side direction Y. The pair of cavities 36e is provided with the cavity 36d therebetween along the short-side direction Y. The pair of cavities 36f is provided with the cavity 36d and the pair of cavities 36e therebetween along the short-side direction Y.

The fuse holder 37 is intended to hold the fuses 22 as the plurality of electronic components 2, as illustrated in FIGS. 2 and 3. The fuse holder 37 is formed in the shape of an almost rectangular frame such that the long-side direction X aligns with the long side and the short-side direction Y aligns with the short side. The fuse holder 37 is attached and assembled to the holder attachment portion 36c of the bus bar block 36. The fuse holder 37 has a plurality of fuse housing concave portions 37a. While the fuse holder 37 is assembled into the bus bar block 36, the exposed ends 35a of the fuse bus bars 35 are exposed and positioned in the fuse housing concave portions 37a via insertion holes not illustrated. Each of the fuse housing concave portions 37a is open to one side in the long-side direction X. When the fuse 22 is fitted into the fuse housing concave portion 37a from one side in the long-side direction X, the fuse housing concave portion 37a houses and holds the fuse 22 therein while electrically connecting the fuse 22 and the fuse bus bar 35 via the exposed end 35a. In this case, since the large number of fuses 22 is assembled into the large number of fuse housing concave portions 37a, the fuse holder 37 constitutes a heavy article that is heavier than the other components in the electrical connection box 1. The fuse cover 38 is attached to the fuse holder 37 along the long-side direction X to protect the fuses 22 in the fuse housing concave portions 37a.

The housing 4 includes a first cover 41 and a second cover 42 that are opposed to each other along the thickness direction Z, and has internally the housing space portion 43 formed by the first cover 41 and the second cover 42 as illustrated in FIGS. 1 and 2. The housing 4 has a two-layered structure in which the first cover 41 and the second cover 42 are separated from each other. The first cover 41 and the second cover 42 are formed from an insulating synthetic resin. The housing 4 is entirely formed in the shape of a hollow box by assembling the first cover 41 and the second cover 42, and has the housing space portion 43 in the hollow interior. The housing 4 houses the substrate assembly 3 in the housing space portion 43. The housing 4 houses the substrate assembly 3 in the housing space portion 43 while exposing part of the substrate assembly 3 to the outside.

More specifically, the first cover 41 is a dish-like (tray-like) member. The first cover 41 includes a main surface wall portion 41a and a peripheral wall portion 41b, and is formed in the shape of a hollow box by integrating these walls. The main surface wall portion 41a is formed in the shape of an almost rectangular plate as with the substrate 31, and is opposed to the substrate 31 along the thickness direction Z while the substrate assembly 3 is housed in the housing space portion 43. The peripheral wall portion 41b is erected from the outer peripheral portion of the main surface wall portion 41a along the thickness direction Z. In this case, the first cover 41 has a connector exposure hole 41c and an ECU housing concave portion 41d in the main surface wall portion 41a. The connector exposure hole 41c is a hole for exposing the ECU connector 33 to the outside of the housing 4, which is formed to penetrate through the main surface wall portion 41a along the thickness direction Z. In this case, the connector exposure hole 41c is positioned in the main surface wall portion 41a at a position closer to one side with respect to the center in the long-side direction X. The ECU housing concave portion 41d is a concave portion for housing the ECU 24, which is formed in the outer surface of the main surface wall portion 41a (opposite to the housing space portion 43 side). Similarly, the second cover 42 is a dish-like (tray-like) member. The second cover 42 includes a main surface wall portion 42a and a peripheral wall portion 42b, and is formed in the shape of a hollow box by integrating these walls. The main surface wall portion 42a is formed in the shape of an almost rectangular plate as with the substrate 31, and is opposed to the substrate 31 along the thickness direction Z while the substrate assembly 3 is housed in the housing space portion 43. The peripheral wall portion 42b is erected from the outer peripheral portion of the main surface wall portion 42a along the thickness direction Z. The first cover 41 and the second cover 42 are opposed to each other along the thickness direction Z and assembled to each other via various forms of lock mechanisms to constitute the almost rectangular parallelepiped-shaped housing 4 and form the housing space portion 43 in the hollow interior. That is, the housing space portion 43 is a spatial portion that is formed by the first cover 41 and the second cover 42 and is sandwiched between the first cover 41 and the second cover 42. The housing 4 houses the substrate assembly 3 in the housing space portion 43 while exposing the PCB connector 32 on the both sides in the short-side direction Y, exposing the fuse holder 37 on the other side in the long-side direction X, and exposing the ECU connector 33 via the connector exposure hole 41c on the one side in the thickness direction Z.

The first cover 41 in the embodiment has an FL holder 44, the first flexible rib 45, the second flexible ribs 46, the boss portions 47, a third flexible rib 48, and a fourth flexible rib 49, which are integrally formed together with the main surface wall portion 41a and the peripheral wall portion 41b as illustrated in FIGS. 1, 2, 4, and 6.

The FL holder 44 holds fusible links 23 as the plurality of electronic components 2. The FL holder 44 is provided on the main surface wall portion 41a at a position opposed to the bus bar block 36 in the housing space portion 43 along the thickness direction Z. In this case, the FL holder 44 is positioned on the main surface wall portion 41a, closer to the opposite side to the connector exposure hole 41c (in other words, the other side in the long-side direction X) with respect to the central position in the long-side direction X. The FL holder 44 has a plurality of, in this case, four FL housing concave portions 44a. The four FL housing concave portions 44a are spaced along the short-side direction Y. Each of the FL housing concave portions 44a has an insertion hole 44b in the bottom surface in the thickness direction Z. Each of the insertion holes 44b is opposed to the FL bus bar holding portion 36A of the bus bar block 36 in the housing space portion 43. Each of the insertion holes 44b penetrates through the bottom surface of the FL housing concave portion 44a along the thickness direction Z and communicates internally and externally with the housing space portion 43. The insertion holes 44b allow the exposed ends 34a of the FL bus bars 34 to insert internally and externally through the housing space portion 43 along the thickness direction Z. The FL holder 44 is positioned such that the exposed ends 34a of the FL bus bars 34 are exposed in the FL housing concave portions 44a via the insertion holes 44b. One each of the exposed ends 34a of the first bus bars 34A and one each of the exposed ends 34a of the second bus bars 34B are positioned in each of the FL housing concave portions 44a. Each of the FL housing concave portions 44a is open to one side in the thickness direction Z. When the fusible link 23 is fitted into the FL housing concave portion 44a from the one side in the thickness direction Z, the FL housing concave portion 44a houses and holds the fusible link 23 while electrically connecting the fusible link 23 and the FL bus bar 34 via the exposed end 34a.

Figure 6:
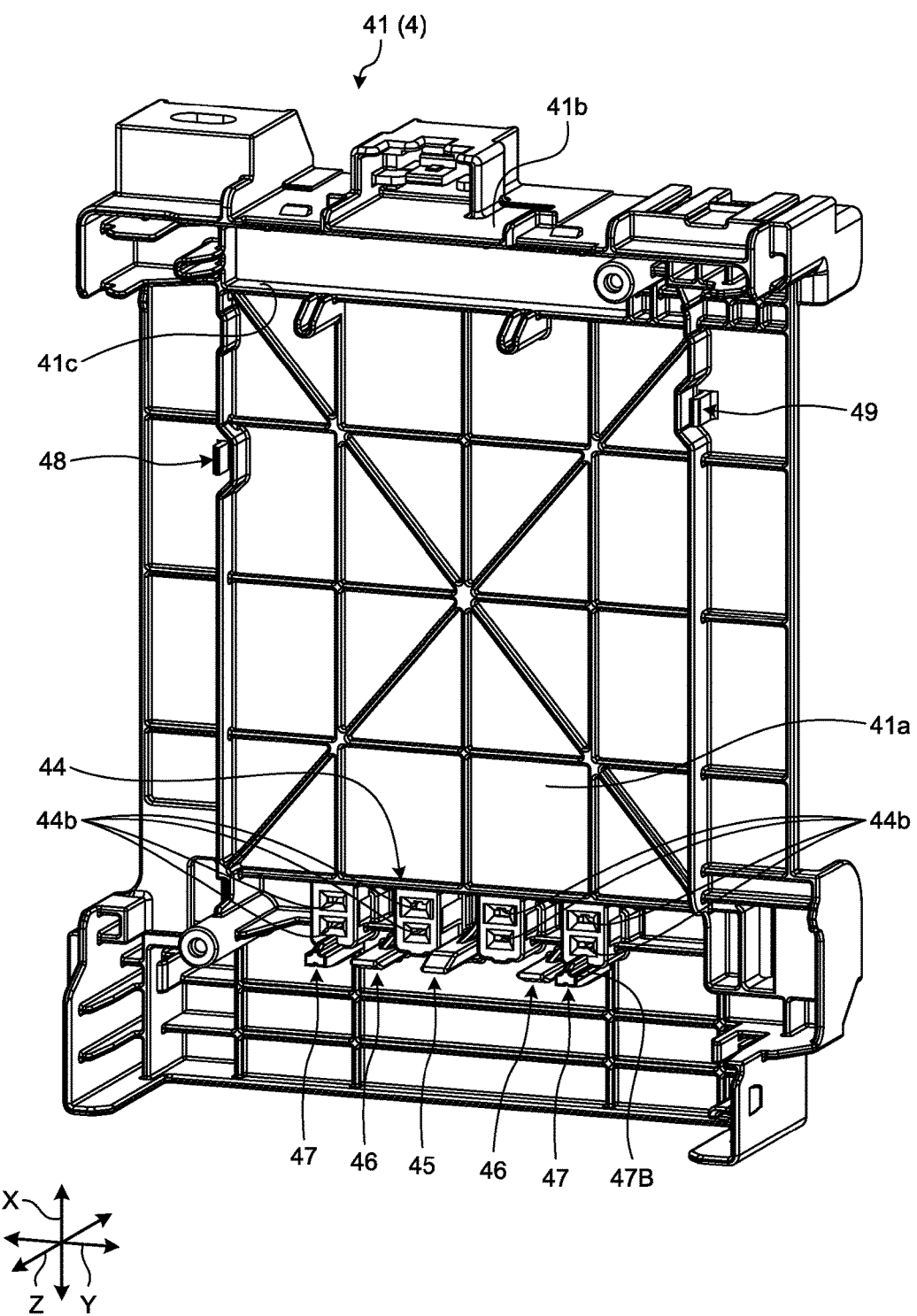
FIG. 6 is a perspective view of a schematic configuration of a first cover in the electrical connection box according to the embodiment.
Figure 7:
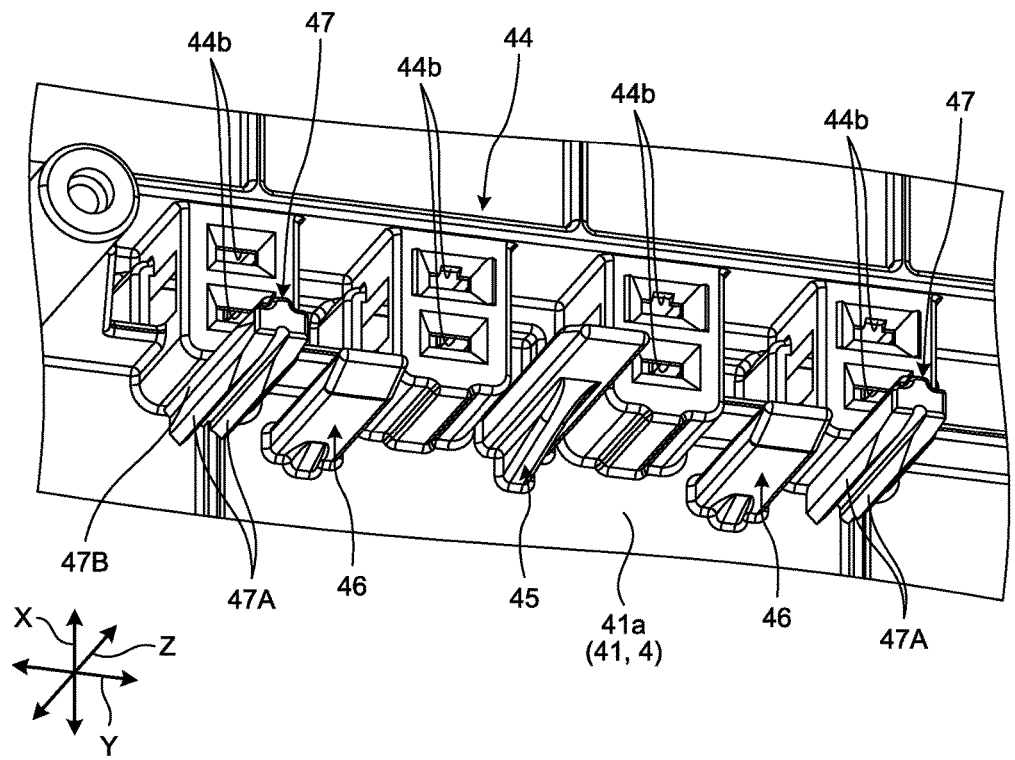
FIG. 7 is a partial perspective view of the electrical connection box including a first flexible rib, second flexible ribs, and boss portions according to the embodiment.
Figure 8:
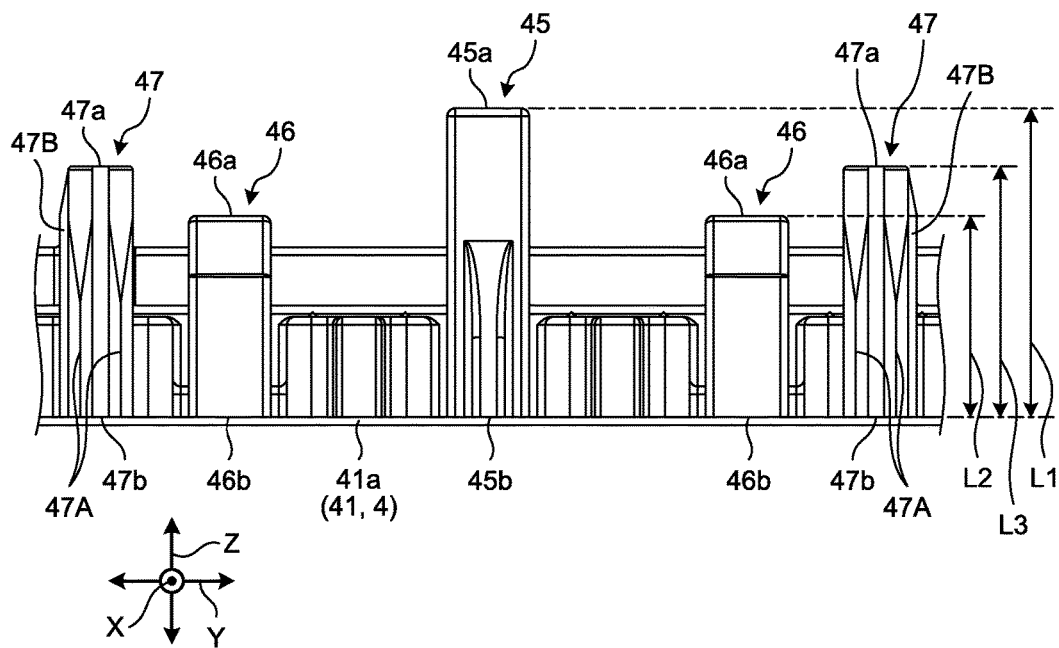
FIG. 8 is a partial side view of the first cover in the electrical connection box including the first flexible rib, the second flexible ribs, and the boss portions according to the embodiment.

The first flexible rib 45, the second flexible ribs 46, the boss portions 47, the third flexible rib 48, and the fourth flexible rib 49 are formed in a bar-like shape protruding from the surface of the main surface wall portion 41a of the first cover 41 on the housing space portion 43 side along the thickness direction Z as illustrated in FIGS. 6 to 8. In this case, the extending direction of the first flexible rib 45, the second flexible ribs 46, the boss portions 47, the third flexible rib 48, and the fourth flexible rib 49 and the insertion direction of the exposed ends 34a of the FL bus bars 34 into the insertion holes 44b align with each other, that is, both of the directions align with the thickness direction Z.

The first flexible rib 45, the second flexible ribs 46, and the boss portions 47 are positioned near the FL holder 44. That is, the first flexible rib 45, the second flexible ribs 46, and the boss portions 47 are positioned on the main surface wall portion 41a, closer to the opposite side of the connector exposure hole 41c (in other words, the other side in the long-side direction X) with respect to the central position in the long-side direction X. More specifically, the first flexible rib 45, the second flexible ribs 46, and the boss portions 47 are integrally formed together with wall bodies constituting the FL housing concave portions 44a and positioned on the opposite side of the connector exposure hole 41c with respect to the long-side direction X in the FL holder 44.

The first flexible rib 45, the second flexible ribs 46, and the boss portions 47 are spaced along the short-side direction Y. In this case, the one first flexible rib 45 is provided in almost the center of the main surface wall portion 41a in the short-side direction Y. The pair of second flexible ribs 46 is provided with the first flexible rib 45 therebetween along the short-side direction Y. The pair of boss portions 47 is provided with the first flexible rib 45 and the pair of second flexible ribs 46 therebetween along the short-side direction Y. The first flexible rib 45 is provided on the main surface wall portion 41a such that the first flexible rib 45 is insertable into the cavity 36d of the bus bar block 36 along the thickness direction Z. Each of the second flexible ribs 46 is provided on the main surface wall portion 41a such that each of the second flexible ribs 46 is insertable into the cavitie 36e of the bus bar block 36 along the thickness direction Z. Each of the boss portions 47 is provided on the main surface wall portion 41a such that each of the boss portions 47 is insertable into the cavitie 36f of the bus bar block 36 along the thickness direction Z.

Figure 9:
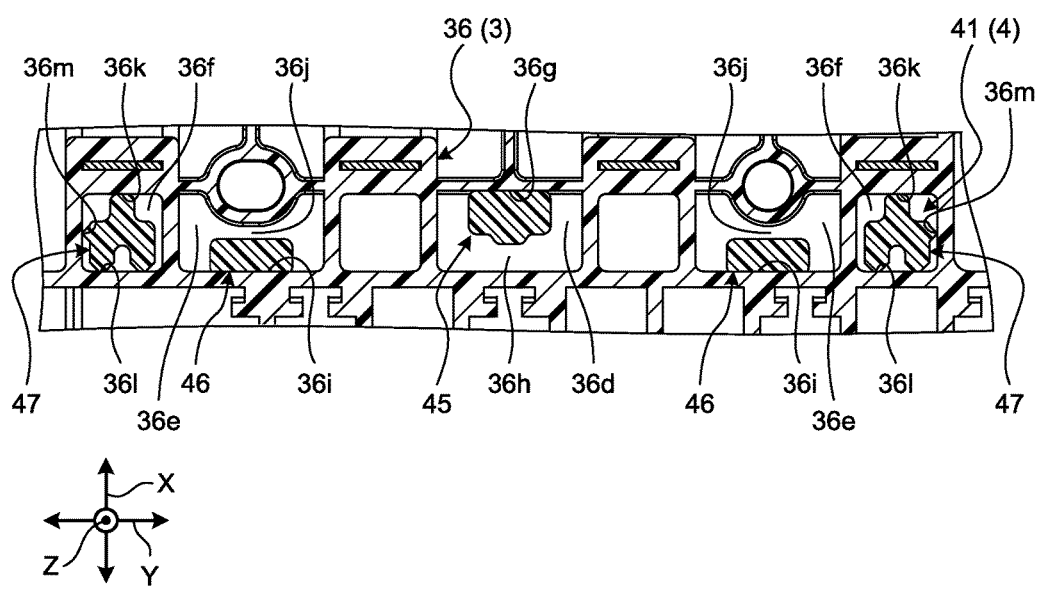
FIG. 9 is a partial cross-section view of the electrical connection box including the first flexible rib, the second flexible ribs, and the boss portions according to the embodiment.

The first flexible rib 45 and the second flexible ribs 46 are elastically deformable along the long-side direction X as the first support direction of the substrate assembly 3. The first flexible rib 45 supports the substrate assembly 3 with respect to the one side in the long-side direction X to restrict the movement of the substrate assembly 3 to the other side in the long-side direction X. More specifically, while being inserted into the cavity 36d of the bus bar block 36, the first flexible rib 45 abuts with a first abutment surface 36g as an inner wall surface of the cavity 36d on one side in the long-side direction X as illustrated in FIG. 9. According to this configuration, the first flexible rib 45 restricts the relative displacement of the substrate assembly 3 to the other side in the long-side direction X. In this state, the first flexible rib 45 has a deformation allowable space portion 36h in the cavity 36d between the first flexible rib 45 and the inner wall surface opposite to the first abutment surface 36g in the long-side direction X (in other words, the other side in the long-side direction X). According to this configuration, the first flexible rib 45 is allowed to deform elastically to the opposite side of the first abutment surface 36g in the cavity 36d along the long-side direction X. Each of the second flexible ribs 46 supports the substrate assembly 3 with respect to the other side in the long-side direction X to restrict the movement of the substrate assembly 3 to the one side in the long-side direction X. More specifically, when being inserted into the cavity 36e of the bus bar block 36, each of the second flexible ribs 46 abuts with a second abutment surface 36i as an inner wall surface of the cavity 36e on the other side in the long-side direction X as illustrated in FIG. 9. According to this configuration, each of the second flexible ribs 46 restricts the relative displacement of the substrate assembly 3 to the one side in the long-side direction X. In this state, each of the second flexible ribs 46 has a deformation allowable space portion 36j in the cavity 36e between the second flexible rib 46 and the inner wall surface opposite to the second abutment surface 36i in the long-side direction X (in other words, the one side in the long-side direction X). According to this configuration, each of the second flexible ribs 46 is allowed to deform elastically to the opposite side of the second abutment surface 36i in the cavity 36e along the long-side direction X. The first flexible rib 45 and the second flexible ribs 46 have tapered surfaces as guide surfaces for insertion into the cavities 36d and 36e on the first abutment surface 36g side and the second abutment surface 36i side of their respective leading ends.

The boss portions 47 position the substrate assembly 3 on the both sides in the long-side direction X. Each of the boss portions 47 is formed as high-stiffness portions relative to the first flexible rib 45 and the second flexible ribs 46. More specifically, while being inserted into the cavity 36e of the bus bar block 36, each of the boss portions 47 abuts with third abutment surfaces 36k and 36l as inner wall surfaces of the cavity 36f on the both sides in the long-side direction X as illustrated in FIG. 9. According to this configuration, each of the boss portions 47 positions the substrate assembly 3 while restricting the relative displacement of the substrate assembly 3 to the both sides in the long-side direction X. In this case, each of the boss portions 47 has a crush rib 47A (see FIGS. 7 and 8) extending along the thickness direction Z on one surface in the long-side direction X (in this case, the surface on the other side in the long-side direction X). The crush ribs 47A are formed as portions that are plastically deformed when the boss portions 47 are press-fitted into the cavities 36e. According to this configuration, when each of the boss portions 47 is press-fitted into the cavitie 36e, the crush ribs 47A are crushed and plastically deformed. As a result, the boss portions 47 can abut with the third abutment surfaces 36k and 36l on the both sides of the cavities 36f in the long-side direction X while absorbing variations in assembly tolerance and dimensional tolerance of the individual components. In this case, each of the boss portions 47 also has a crush rib 47B (see FIGS. 7 and 8) extending along the thickness direction Z on one surface in the short-side direction Y. The pair of boss portions 47 is each provided with the crush rib 47B on the surface opposite of the surfaces opposed to each other in the short-side direction Y. According to this configuration, when each of the boss portions 47 is press-fitted into the cavitie 36e, the crush ribs 47B are crushed and plastically deformed. As a result, the boss portions 47 can abut with fourth abutment surfaces 36m as inner wall surfaces of the cavities 36f in the short-side direction Y while absorbing variations in assembly tolerance and dimensional tolerance of the individual components. Consequently, each of the boss portions 47 positions the substrate assembly 3 while restricting the relative displacement of the substrate assembly 3 to the both sides in the short-side direction Y.

The first flexible rib 45, the second flexible ribs 46, and the boss portions 47 in the embodiment protrude and extend to the same side along the thickness direction Z from an inner wall surface forming the housing space portion 43, in this case, the inner wall surface of the main surface wall portion 41a as illustrated in FIG. 8. The first flexible rib 45, the second flexible ribs 46, and the boss portions 47 are formed such that their respective leading end positions 45a, 46a, and 47a are different from one another with respect to the thickness direction Z. According to this configuration, when the substrate assembly 3 and the first cover 41 are assembled to each other, the first flexible rib 45, the second flexible ribs 46, and the boss portions 47 are inserted into the cavities 36d, 36e, and 36f at timings shifted from one another. Specifically, the first flexible rib 45, the pair of second flexible ribs 46, and the pair of boss portions 47 have their respective base end positions 45b, 46b, and 47b aligned with respect to the thickness direction Z. The first flexible rib 45, the pair of second flexible ribs 46, and the pair of boss portions 47 have their respective lengths along the thickness direction Z that are larger in the order of the pair of second flexible ribs 46, the pair of boss portions 47, and the first flexible rib 45. That is, the first flexible rib 45, the pair of second flexible ribs 46, and the pair of boss portions 47 are formed such that their respective lengths L1, L2, and L3 along the thickness direction Z meet Equation (1) below. In Equation (1), "L1" represents the length from the base end position 45b to the leading end position 45a of the first flexible rib 45 along the thickness direction Z, "L2" represents the length from the base end position 46b to the leading end position 46a of the second flexible rib 46 along the thickness direction Z, and "L3" represents the length from the base end position 47b to the leading end position 47a of the boss portion 47 along the thickness direction Z.

$$L2 < L3 < L1 \quad (1)$$

In this case, the first flexible rib 45 and the second flexible ribs 46 are adjusted in shape such that they are equal in elastic force while they elastically support the substrate assembly 3. The first flexible rib 45 is relatively thick in the long-side direction X, whereas the second flexible ribs 46 are relatively thin in the long-side direction X. According to this configuration, the elastic force of the one first flexible rib 45 is adjusted to be equal to the total elastic force of the two second flexible ribs 46. As a result, the one first flexible rib 45 and the two second flexible ribs 46 can support the substrate assembly 3 by the equal elastic forces with respect to the both sides in the long-side direction X. The elastic forces of the first flexible rib 45 and the second flexible ribs 46 may be adjusted by the width in the short-side direction Y, the length in the thickness direction Z, or the like, as well as the thickness in the long-side direction X.

The third flexible rib 48 and the fourth flexible rib 49 are closer to the opposite side of the first flexible rib 45, the second flexible ribs 46, and the boss portions 47 (in other words, the one side in the long-side direction X) on the main surface wall portion 41a with respect to the central position in the long-side direction X as illustrated in FIG. 6. That is, the third flexible rib 48 and the fourth flexible rib 49 are closer to the connector exposure hole 41c side of the main surface wall portion 41a with respect to the central position in the long-side direction X. The third flexible rib 48 is closer to the one side of the main surface wall portion 41a, and the fourth flexible rib 49 is closer to the other side of the main surface wall portion 41a, with respect to the central position in the short-side direction Y. The third flexible rib 48 and the fourth flexible rib 49 are positioned on the main surface wall portion 41a such that they can abut with the end surfaces of the connector blocks 32b of the PCB connector 32 on the substrate 31 side.

Figure 10:
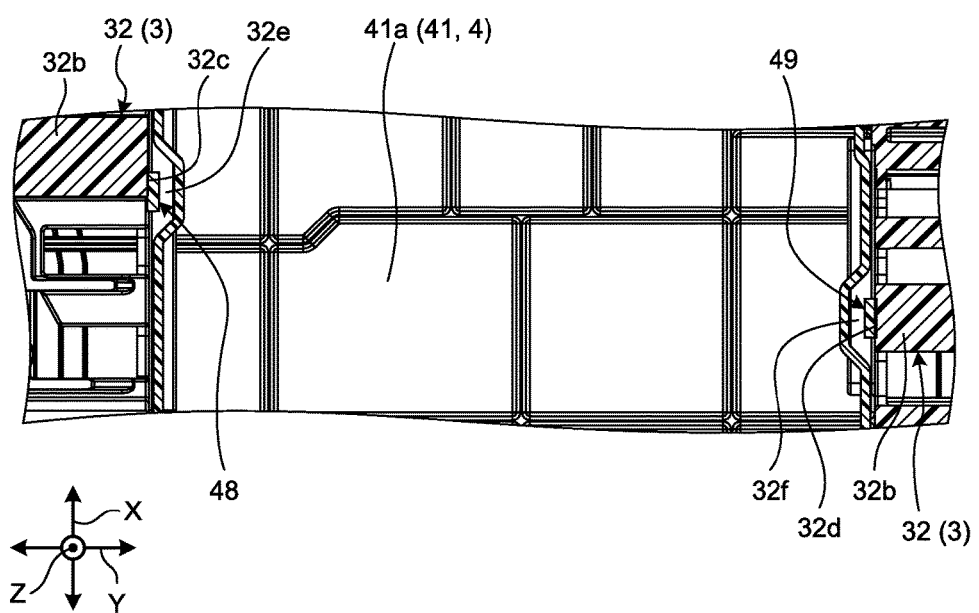
FIG. 10 is a partial cross-section view of the electrical connection box including a third flexible rib and a fourth flexible rib according to the embodiment.

The third flexible rib 48 and the fourth flexible rib 49 are elastically deformable along the short-side direction Y as the second support direction of the substrate assembly 3. The third flexible rib 48 supports the substrate assembly 3 with respect to the one side in the short-side direction Y to restrict the movement of the substrate assembly 3 to the other side in the short-side direction Y. More specifically, the third flexible rib 48 abuts with a fifth abutment surface 32c formed on the end surface of the connector block 32b of the PCB connector 32 on the substrate 31 side as illustrated in FIG. 10. According to this configuration, the third flexible rib 48 restricts the relative displacement of the substrate assembly 3 to the other side in the short-side direction Y. In this state, the third flexible rib 48 has a deformation allowable space portion 32e on the opposite side of the fifth abutment surface 32c in the short-side direction Y. According to this configuration, the third flexible rib 48 is allowed to deform elastically to the opposite side of the fifth abutment surface 32c along the short-side direction Y. Meanwhile, the fourth flexible rib 49 supports the substrate assembly 3 with respect to the other side in the short-side direction Y to restrict the movement of the substrate assembly 3 to the one side in the short-side direction Y. More specifically, the fourth flexible rib 49 abuts with a sixth abutment surface 32d formed on the end surface of the connector block 32b of the PCB connector 32 on the substrate 31 side as illustrated in FIG. 10. According to this configuration, the fourth flexible rib 49 restricts the relative displacement of the substrate assembly 3 to the one side in the short-side direction Y. In this state, the fourth flexible rib 49 has a deformation allowable space portion 32f on the opposite side of the sixth abutment surface 32d in the short-side direction Y. According to this configuration, the fourth flexible rib 49 is allowed to deform elastically to the other side of the sixth abutment surface 32d along the short-side direction Y. The third flexible rib 48 and the fourth flexible rib 49 have tapered surfaces as guide surfaces for insertion into space beside the fifth abutment surface 32c and the sixth abutment surface 32d on the fifth abutment surface 32c side and the sixth abutment surface 32d side of their respective leading ends. In this case, the third flexible rib 48 and the fourth flexible rib 49 are almost equal in length along the thickness direction Z.

In the thus configured electrical connection box 1, first, the first cover 41 is assembled to the substrate assembly 3 in a predetermined positional relationship. In this case, the first cover 41 is assembled such that, after the first flexible rib 45 starts to be inserted into the cavity 36d of the bus bar block 36, the boss portions 47 start to be press-fitted into the cavities 36f, and then the second flexible ribs 46 start to be inserted into the cavities 36e of the bus bar block 36. In the first cover 41, while the first flexible rib 45, the second flexible ribs 46, and the boss portions 47 are fully inserted into the cavities 36d, 36e, and 36f, the first flexible rib 45, the second flexible ribs 46, the boss portions 47, the third flexible rib 48, and the fourth flexible rib 49 are respectively in abutment with the first abutment surface 36g, the second abutment surface 36i, the third abutment surfaces 36k and 36l, the fourth abutment surface 36m, the fifth abutment surface 32c, and the sixth abutment surface 32d. In this state, in the first cover 41, the exposed ends 34a of the FL bus bars 34 are inserted into the insertion holes 44b along the thickness direction Z, and the ECU connector 33 is inserted into the connector exposure hole 41c along the thickness direction Z. The second cover 42 is assembled into the electrical connection box 1 from the opposite side of the first cover 41 with the substrate assembly 3 therebetween with respect to the thickness direction Z. In this case, in the electrical connection box 1, while the substrate assembly 3 is sandwiched in the housing space portion 43 between the first cover 41 and the second cover 42 along the thickness direction Z, the first cover 41 and the second cover 42 are locked via the lock mechanism and assembled to each other. In the electrical connection box 1, the first cover 41, the substrate 31, and the second cover 42 are integrated by fastening together with a tightening member such as screws. In this state, in the electrical connection box 1, the PCB connector 32 is exposed to the both sides in the short-side direction Y and the fuse holder 37 is exposed to the other side in the long-side direction X between the first cover 41 and the second cover 42. In this state, in the electrical connection box 1, the ECU connector 33 is exposed in the ECU housing concave portion 41d via the connector exposure hole 41c. In the electrical connection box 1, the fuses 22, the fusible links 23, the ECU 24, the fuse cover 38, and others are assembled into the ECU connector 33, the fuse holder 37, the FL holder 44, and others, and the counterpart connectors C are fitted to the PCB connector 32. In this case, the electrical connection box 1 is mounted on a vehicle such that the long-side direction X aligns with the perpendicular direction.

The electrical connection box 1 and the wire harness WH described above have the substrate assembly 3 formed by assembling the substrate 31, the PCB connector 32, the ECU connector 33, the FL bus bars 34, the fuse bus bars 35, the bus bar block 36, the fuse holder 37, and the fuse cover 38 to one another. In the electrical connection box 1, while the FL bus bars 34 are inserted into the insertion holes 44b of the housing 4 along the thickness direction Z, the substrate assembly 3 is housed in the housing space portion 43 of the housing 4. In this state, the electrical connection box 1 supports the substrate assembly 3 with respect to the one side in the long-side direction X by the first flexible rib 45 elastically deformable along the long-side direction X crossing the thickness direction Z. According to this configuration, the electrical connection box 1 can restrict the displacement of the substrate assembly 3 to the other side in the long-side direction X while absorbing variations in assembly tolerance and dimensional tolerance of the individual components along the long-side direction X. Meanwhile, the electrical connection box 1 supports the substrate assembly 3 with respect to the other side in the long-side direction X by the second flexible ribs 46 elastically deformable along the long-side direction X. According to this configuration, the electrical connection box 1 can restrict the displacement of the substrate assembly 3 to the one side in the long-side direction X while absorbing variations in assembly tolerance and dimensional tolerance of the individual components along the long-side direction X. The electrical connection box 1 positions the substrate assembly 3 by the boss portions 47 with respect to the both sides in the long-side direction X. As a result, the electrical connection box 1 can restrict the relative movement of the substrate assembly 3 and the housing 4 along the long-side direction X while absorbing variations in the individual components, thereby suppressing a backlash. For example, when being installed in a vehicle, the electrical connection box 1 tends to be affected by vibrations of the vehicle with respect to the long-side direction X along the perpendicular direction. However, in the electrical connection box 1 of the embodiment, the first flexible rib 45, the second flexible ribs 46, and the boss portions 47 cooperate to restrict the relative movement of the substrate assembly 3 and the housing 4 and suppress a backlash properly even with vibrations of the vehicle with respect to the long-side direction X. The electrical connection box 1 can restrict the relative movement of the substrate assembly 3 and the housing 4 with respect to the long-side direction X, which makes it possible to suppress the action of stress resulting from the relative movement on the exposed ends 34a of the FL bus bars 34 inserted into the insertion holes 44b along the thickness direction Z crossing the long-side direction X. The electrical connection box 1 allows the substrate assembly 3 and the housing 4 to be assembled to each other while absorbing variations in assembly tolerance and dimensional tolerance of the individual components along the long-side direction X, which makes it possible to improve the workability of assembly and reduce manufacturing costs, for example. As a result, the electrical connection box 1 and the wire harness WH can hold properly the substrate assembly 3 as an internal component housed in the housing 4.

More specifically, in the electrical connection box 1 and the wire harness WH described above, the substrate assembly 3 has the bus bar block 36. The bus bar block 36 is assembled into a position opposed to the insertion holes 44b along the thickness direction Z to hold the FL bus bars 34 in the housing space portion 43. The bus bar block 36 has the first abutment surface 36g to abut with the first flexible rib 45, the second abutment surface 36i to abut with the second flexible ribs 46, and the cavities 36f into which the boss portions 47 are to be inserted, having the third abutment surfaces 36k and 36l to abut with the boss portions 47 on the both sides in the long-side direction X. According to this configuration, the electrical connection box 1 can restrict directly the displacement of the bus bar block 36 holding the FL bus bars 34 along the long-side direction X by the first flexible rib 45, the second flexible ribs 46, and the boss portions 47 in the vicinities of the insertion holes 44b into which the exposed ends 34a of the FL bus bars 34 are inserted. As a result, the electrical connection box 1 can suppress more effectively and reliably the action of the stress resulting from the relative movement on the exposed ends 34a of the FL bus bars 34 inserted into the insertion holes 44b. This makes it possible to hold more properly the substrate assembly 3 as an internal component housed in the housing 4.

In this case, in the electrical connection box 1 and the wire harness WH described above, the fuse holder 37 constituting a relatively heavy article is assembled into the bus bar block 36, and thus the bus bar block 36 tends to be swung by the vibrations of the vehicle and the like. However, the electrical connection box 1 can restrict directly the relative movement of the bus bar block 36 and properly suppress a backlash by the first flexible rib 45, the second flexible ribs 46, and the boss portions 47 as described above. In this respect as well, the electrical connection box 1 can hold more properly the substrate assembly 3 as an internal component housed in the housing 4.

The electrical connection box 1 and the wire harness WH described above are configured such that the respective leading end positions 45a, 46a, and 47a of the first flexible rib 45, the second flexible ribs 46, and the boss portions 47 with respect to the thickness direction Z are different from one another. According to this configuration, in the electrical connection box 1, when the substrate assembly 3 and the housing 4 (the first cover 41) are assembled to each other, the first flexible rib 45, the second flexible ribs 46, and the boss portions 47 can be inserted into the cavities 36d, 36e, and 36f at timings shifted from one another. As a result, the electrical connection box 1 can suppress the concentration of the insertion force necessary for assembly of the substrate assembly 3 and the housing 4 (the first cover 41) on one specific time, thereby reducing the maximum insertion force necessary for assembly. Accordingly, the electrical connection box 1 can improve the workability of assembling the substrate assembly 3 and the housing 4, thereby reducing the manufacturing costs, for example.

Specifically, the electrical connection box 1 and the wire harness WH described above can support the substrate assembly 3 in a balanced manner by the first flexible rib 45, the pair of second flexible ribs 46, and the pair of boss portions 47. The electrical connection box 1 is configured such that the lengths of the pair of second flexible ribs 46, the pair of boss portions 47, and the first flexible rib 45 along the thickness direction Z are larger in this order. According to this configuration, in the electrical connection box 1, when the housing 4 (the first cover 41) is assembled to the substrate assembly 3, the first flexible rib 45, the boss portions 47, and the second flexible ribs 46 can be inserted into the cavities 36d, 36e, and 36f in this order, for example. Accordingly, in the electrical connection box 1, for insertion of the boss portions 47 requiring the largest insertion force, for example, the housing 4 (the first cover 41) can be provisionally positioned in the substrate assembly 3 by the first flexible rib 45 before the boss portions 47 start to be inserted. As a result, in the electrical connection box 1, the boss portions 47 requiring the largest insertion force can be easily inserted while proper force is properly applied to the boss portions 47. In addition, in the electrical connection box 1, the second flexible ribs 46 that tend to have their respective elastic forces weaker than that of the first flexible rib 45 can be lastly inserted. This makes it possible to reduce the necessary force at the final stage of the assembly while absorbing variations in assembly tolerance and dimensional tolerance of the individual components. In these respects as well, the electrical connection box 1 can improve the workability of assembling the substrate assembly 3 and the housing 4.

The electrical connection box 1 and the wire harness WH described above support the substrate assembly 3 with respect to the one side in the short-side direction Y crossing the thickness direction Z and the long-side direction X, by the third flexible rib 48 elastically deformable along the short-side direction Y. According to this configuration, the electrical connection box 1 can restrict the displacement of the substrate assembly 3 to the other side in the short-side direction Y while absorbing variations in assembly tolerance and dimensional tolerance of the individual components along the short-side direction Y. In addition, the electrical connection box 1 supports the substrate assembly 3 with respect to the other side in the short-side direction Y by the fourth flexible rib 49 elastically deformable along the short-side direction Y. According to this configuration, the electrical connection box 1 can restrict the displacement of the substrate assembly 3 to the one side in the short-side direction Y while absorbing variations in assembly tolerance and dimensional tolerance of the individual components along the short-side direction Y. As a result, the electrical connection box 1 can also restrict the relative movement of the substrate assembly 3 and the housing 4 along the short-side direction Y and suppress a backlash while absorbing variations in the individual components. This makes it possible to hold more properly the substrate assembly 3 as an internal component housed in the housing 4. In addition, according to this configuration, the electrical connection box 1 can support easily more various installing directions with improvement in general versatility.

The electrical connection box and the wire harness according to the embodiment of the present invention described above are not limited to the foregoing embodiment but can be modified in various manners within the scope of the claims.

In the foregoing description, the extending direction of the first flexible rib 45, the second flexible ribs 46, the boss portions 47, the third flexible rib 48, and the fourth flexible rib 49 align with the insertion direction of the exposed ends 34a of the FL bus bars 34 into the insertion holes 44b. However, these directions may not necessarily align with each other. At least the insertion direction, and the extending direction and the first support direction (the long-side direction X in the foregoing example) need to cross each other. For example, the extending direction may align with the thickness direction Z, and the insertion direction may align with the short-side direction Y. In other words, the insertion direction may align with the second support direction. In the foregoing description, while the electrical connection box 1 is mounted on a vehicle and the vehicle is positioned on a horizontal plane, the long-side direction X aligns with the perpendicular direction, and the short-side direction Y and the thickness direction Z align with the horizontal direction. However, the present invention is not limited to this.

In the foregoing description, the one first flexible rib 45 is provided, and the pair of second flexible ribs 46 and the pair of boss portions 47 are provided. However, the present invention is not limited to this but at least one each of them may be provided. The first flexible rib 45, the second flexible ribs 46, and the boss portions 47 may not be spaced along the short-side direction Y. In the foregoing description, the lengths of the first flexible rib 45, the second flexible ribs 46, and the boss portions 47 in the thickness direction Z are longer in the order of the pair of second flexible ribs 46, the pair of boss portion 47, and the first flexible rib 45. However, the present invention is not limited to this. The respective leading end positions 45a, 46a, and 47a of the first flexible rib 45, the second flexible ribs 46, and the boss portions 47 may align with one another with respect to the thickness direction Z.

In the foregoing description, the housing 4 (the first cover 41) has the third flexible rib 48 and the fourth flexible rib 49. However, the present invention is not limited to this but may not have the third flexible rib 48 and the fourth flexible rib 49.

In an electrical connection box and a wire harness according to the present embodiment, a substrate and a conductive member are assembled to each other to constitute a substrate assembly. In the electrical connection box, while the conductive member is inserted into an insertion hole in a housing along an insertion direction, the substrate assembly is housed in a housing space portion of the housing. In this state, the electrical connection box supports the substrate assembly by a first flexible rib elastically deformable along a first support direction crossing the insertion direction, with respect to one side in the first support direction. According to this configuration, the electrical connection box can restrict the displacement of the substrate assembly to the other side in the first support direction while absorbing variations in the individual components along the first support direction. The electrical connection box also supports the substrate assembly by a second flexible rib elastically deformable along the first support direction, with respect to the other side in the first support direction. According to this configuration, the electrical connection box can restrict the displacement of the substrate assembly to the one side in the first support direction while absorbing variations in the individual components along the first support direction. Then, the electrical connection box positions the substrate assembly by a boss portion on both sides in the first support direction. As a result, the electrical connection box can restrict the relative movement of the substrate assembly and the housing along the first support direction while absorbing variations in the individual components, thereby suppressing a backlash. As a result, the electrical connection box and the wire harness can hold properly the substrate assembly as an internal component housed in the housing.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An electrical connection box, comprising:
a substrate assembly that has a substrate on which an electronic component is provided and a conductive member extended from the substrate, the substrate and the conductive member being assembled to each other; and
a housing comprising a housing space portion that is internally formed to house the substrate assembly, and:
an insertion hole that communicates internally and externally with the housing space portion to receive the conductive member along an insertion direction,
a first flexible rib that is extended along the insertion direction, elastically deformable along first and second deforming directions that are opposite to each other and cross the insertion direction, and restricts movement of the substrate assembly towards the first deforming direction,
a second flexible rib that is extended along the insertion direction, elastically deformable along the first and second deforming directions, and restricts movement of the substrate assembly towards the second deforming direction, and
a boss portion that is extended along the insertion direction and restricts movement of the substrate assembly along both the first and second deforming directions.

2. The electrical connection box according to claim 1, wherein
the substrate assembly has a block that is assembled to the substrate at a position opposed to the insertion hole along the insertion direction to hold the conductive member in the housing space portion, and
the block has a first abutment surface to abut with the first flexible rib, a second abutment surface to abut with the second flexible rib, and a positioning concave portion into which the boss portion is inserted, having a third abutment surface to abut with the boss portion.

3. The electrical connection box according to claim 2, wherein
an article holding a plurality of electronic components is assembled to the block.

4. The electrical connection box according to claim 1, wherein
the first flexible rib, the second flexible rib, and the boss portion protrude and extend to the same side along the insertion direction from an inner wall surface forming the housing space portion and have leading end positions different from one another with respect to the insertion direction.

5. The electrical connection box according to claim 2, wherein
the first flexible rib, the second flexible rib, and the boss portion protrude and extend to the same side along the insertion direction from an inner wall surface forming the housing space portion and have leading end positions different from one another with respect to the insertion direction.

6. The electrical connection box according to claim 3, wherein
the first flexible rib, the second flexible rib, and the boss portion protrude and extend to the same side along the insertion direction from an inner wall surface forming the housing space portion and have leading end positions different from one another with respect to the insertion direction.

7. The electrical connection box according to claim 1, wherein
a pair of second flexible ribs including the second flexible rib is provided with the first flexible rib interposed therebetween,
a pair of boss portions including the boss portion is provided with the first flexible rib and the pair of second flexible ribs interposed therebetween, and
the first flexible rib, the pair of second flexible ribs, and the pair of boss portions protrude and extend to the same direction along the insertion direction from an inner wall surface forming the housing space portion, have base end positions aligned with one another with respect to the insertion direction, and have lengths along the insertion direction that are larger in the order of the pair of second flexible ribs, the pair of boss portions, and the first flexible rib.

8. The electrical connection box according to claim 2, wherein
a pair of second flexible ribs including the second flexible rib is provided with the first flexible rib interposed therebetween,
a pair of boss portions including the boss portion is provided with the first flexible rib and the pair of second flexible ribs interposed therebetween, and
the first flexible rib, the pair of second flexible ribs, and the pair of boss portions protrude and extend to the same direction along the insertion direction from an inner wall surface forming the housing space portion, have base end positions aligned with one another with respect to the insertion direction, and have lengths along the insertion direction that are larger in the order of the pair of second flexible ribs, the pair of boss portions, and the first flexible rib.

9. The electrical connection box according to claim 3, wherein
a pair of second flexible ribs including the second flexible rib is provided with the first flexible rib interposed therebetween,
a pair of boss portions including the boss portion is provided with the first flexible rib and the pair of second flexible ribs interposed therebetween, and
the first flexible rib, the pair of second flexible ribs, and the pair of boss portions protrude and extend to the same direction along the insertion direction from an inner wall surface forming the housing space portion, have base end positions aligned with one another with respect to the insertion direction, and have lengths along the insertion direction that are larger in the order of the pair of second flexible ribs, the pair of boss portions, and the first flexible rib.

10. The electrical connection box according to claim 4, wherein
a pair of second flexible ribs including the second flexible rib is provided with the first flexible rib interposed therebetween,
a pair of boss portions including the boss portion is provided with the first flexible rib and the pair of second flexible ribs interposed therebetween, and
the first flexible rib, the pair of second flexible ribs, and the pair of boss portions protrude and extend to the same direction along the insertion direction from an inner wall surface forming the housing space portion, have base end positions aligned with one another with respect to the insertion direction, and have lengths along the insertion direction that are larger in the order of the pair of second flexible ribs, the pair of boss portions, and the first flexible rib.

11. The electrical connection box according to claim 5, wherein
a pair of second flexible ribs including the second flexible rib is provided with the first flexible rib interposed therebetween,
a pair of boss portions including the boss portion is provided with the first flexible rib and the pair of second flexible ribs interposed therebetween, and
the first flexible rib, the pair of second flexible ribs, and the pair of boss portions protrude and extend to the same direction along the insertion direction from an inner wall surface forming the housing space portion, have base end positions aligned with one another with respect to the insertion direction, and have lengths along the insertion direction that are larger in the order of the pair of second flexible ribs, the pair of boss portions, and the first flexible rib.

12. The electrical connection box according to claim 1, wherein
the housing includes a third flexible rib that is extended along the insertion direction, elastically deformable, and restricts movement of the substrate assembly along a third deforming direction crossing the first and second deforming directions, and a fourth flexible rib that is extended along the insertion direction, elastically deformable, and restricts movement of the substrate assembly along a fourth deforming direction crossing the first and second deforming directions.

13. The electrical connection box according to claim 2, wherein
the housing includes a third flexible rib that is extended along the insertion direction, elastically deformable, and restricts movement of the substrate assembly along a third deforming direction crossing the first and second deforming directions, and a fourth flexible rib that is extended along the insertion direction, elastically deformable, and restricts movement of the substrate assembly along a fourth deforming direction crossing the first and second deforming directions.

14. The electrical connection box according to claim 4, wherein
the housing includes a third flexible rib that is extended along the insertion direction, elastically deformable, and restricts movement of the substrate assembly along a third deforming direction crossing the first and second deforming directions, and a fourth flexible rib that is extended along the insertion direction, elastically deformable, and restricts movement of the substrate assembly along a fourth deforming direction crossing the first and second deforming directions.

15. The electrical connection box according to claim 7, wherein
the housing includes a third flexible rib that is extended along the insertion direction, elastically deformable, and restricts movement of the substrate assembly along a third deforming direction crossing the first and second deforming directions, and a fourth flexible rib that is extended along the insertion direction, elastically deformable, and restricts movement of the substrate assembly along a fourth deforming direction crossing the first and second deforming directions.

16. A wire harness comprising:
a conductive wiring material; and
an electrical connection box electrically connected to the wiring material, wherein
the electrical connection box includes:
a substrate assembly that has a substrate on which an electronic component electrically connected to the wiring material is provided and a conductive member extended from the substrate, the substrate and the conductive member being assembled to each other; and
a housing comprising a housing space portion that is internally formed to house the substrate assembly, and:
an insertion hole that communicates internally and externally with the housing space portion to receive the conductive member along an insertion direction,
a first flexible rib that is extended along the insertion direction, elastically deformable along first and second deforming directions that are opposite to each other and cross the insertion direction, and restricts movement of the substrate assembly towards the first deforming direction,
a second flexible rib that is extended along the insertion direction, elastically deformable along the first and second deforming directions, and restricts movement of the substrate assembly towards the second deforming direction, and
a boss portion that is extended along the insertion direction and restricts movement of the substrate assembly along both the first and second deforming directions.

17. The electrical connection box according to claim 1, wherein the housing further comprises a cover, and the cover comprises the insertion hole, the first flexible rib, the second flexible rib, and the boss portion.

18. The wire harness according to claim 16, wherein the housing further comprises a cover, and the cover comprises the insertion hole, the first flexible rib, the second flexible rib, and the boss portion.

* * * * *